(12) United States Patent
Kuruppu

(10) Patent No.: US 11,789,081 B2
(45) Date of Patent: Oct. 17, 2023

(54) DETECTING FAULTS IN FIELD ORIENTED CONTROLLED PERMANENT MAGNET SYNCHRONOUS MACHINES

(71) Applicant: TEXAS INSTRUMENTS INCORPORATED, Dallas, TX (US)

(72) Inventor: Sandun Shivantha Kuruppu, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/799,278

(22) Filed: Feb. 24, 2020

(65) Prior Publication Data

US 2020/0191871 A1 Jun. 18, 2020

Related U.S. Application Data

(63) Continuation of application No. 15/906,981, filed on Feb. 27, 2018, now Pat. No. 10,571,522, which is a continuation of application No. 14/508,840, filed on Oct. 7, 2014, now Pat. No. 9,903,917.

(51) Int. Cl.
*G01R 31/34* (2020.01)
*H02P 21/22* (2016.01)
*H02P 29/024* (2016.01)

(52) U.S. Cl.
CPC ............ *G01R 31/343* (2013.01); *H02P 21/22* (2016.02); *H02P 29/0241* (2016.02)

(58) Field of Classification Search
None
See application file for complete search history.

(56) References Cited

U.S. PATENT DOCUMENTS

| | | | | |
|---|---|---|---|---|
| 6,288,515 B1 * | 9/2001 | Hiti | ........................ | H02P 6/085 318/722 |
| 2002/0145837 A1 * | 10/2002 | Krefta | ..................... | H02P 21/08 361/23 |
| 2004/0100220 A1 * | 5/2004 | Fu | ........................... | B60L 15/00 318/700 |

(Continued)

FOREIGN PATENT DOCUMENTS

| | | |
|---|---|---|
| CN | 102299680 A | 12/2011 |
| CN | 102684595 A | 9/2012 |

(Continued)

OTHER PUBLICATIONS

International Search Report with Written Opinion for PCT/US2015/054549 dated Jan. 28, 2016.

(Continued)

*Primary Examiner* — Nasima Monsur
(74) *Attorney, Agent, or Firm* — Frank D. Cimino

(57) ABSTRACT

A method includes receiving first and second output signals from a proportional-integral-derivative (PID) regulator circuit, wherein the first and second output signals represent three-phase currents provided into a machine. The method further includes determining a fault detection signal based on the first and second output signals. The method also includes comparing the fault detection signal to a threshold; and detecting a fault in the machine based on the fault detection signal exceeding the threshold.

27 Claims, 5 Drawing Sheets

(56) References Cited

U.S. PATENT DOCUMENTS

| | | | |
|---|---|---|---|
| 2009/0033262 A1* | 2/2009 | Okumura | H02P 6/16 318/400.32 |
| 2009/0184718 A1 | 7/2009 | Ivan et al. | |
| 2010/0320953 A1* | 12/2010 | Yeh | H02P 21/06 318/490 |
| 2012/0038304 A1 | 2/2012 | Yeh | |
| 2012/0139460 A1 | 6/2012 | Senkou et al. | |
| 2012/0217915 A1 | 8/2012 | Wu et al. | |
| 2013/0106331 A1 | 5/2013 | Guzelgunler | |
| 2013/0173193 A1* | 7/2013 | Yan | G01R 31/34 702/66 |
| 2013/0314014 A1 | 11/2013 | Tremel et al. | |
| 2014/0152339 A1 | 6/2014 | Mora Sanchez | |
| 2014/0191697 A1 | 7/2014 | Mao et al. | |

FOREIGN PATENT DOCUMENTS

| | | |
|---|---|---|
| CN | 103454585 A | 12/2013 |
| CN | 101977008 A | 4/2014 |
| CN | 103701394 A | 4/2014 |
| CN | 103926505 A | 7/2014 |
| RU | 2401502 C2 | 10/2010 |
| WO | 2003073185 A2 | 9/2003 |

OTHER PUBLICATIONS

Kuruppu, et al.; "D-Q Current Signature based Single Winding Open Fault Detection for SM-PMAC Machine Drives" IEEE; 2013: pp. 1343-1347.

Kuruppu, et al.; "D-Q Current Signature Based Faulted Phase Localization for SM-PMAC Machine Drives"; IEEE Transactions on Industrial Electronics; 2007; 9 pages.

Gajanayake, et al.; "Fault Tolerant Control Method to Improve the Torque and Speed Response in PMSM Drive with Winding Faults"; IEEE PEDS; Singapore, Dec. 5-8, 2011; pp. 956-961.

Kuruppu, et al.; "Hardware-Software Hybrid Open Single Phase Diagnostic Scheme for PMAC Machines"; IEEE, 2013; 5 pages.

Liu, et al.; "On-Line Identification and Robust Fault Diagnosis for Non-linear PMSM Drives"; American Control Conference; Portland, OR; Jun. 8-10, 2005; pp. 2023-2027.

Liu, et al.; "Fault Detection, Diagnostics, and Prognostics: Software Agent Solutions"; IEEE Transaction on Vehicular Technology, vol. 56. No. 4; Jul. 2007; pp. 1613-1622.

Extended European Search Report for Patent Application No. EP 15848269.5 dated Sep. 14, 2018; 6 pages.

Chinese Search Report for Patent Application No. CN 201580054183 8 dated Aug. 20, 2019; 3 pages.

* cited by examiner

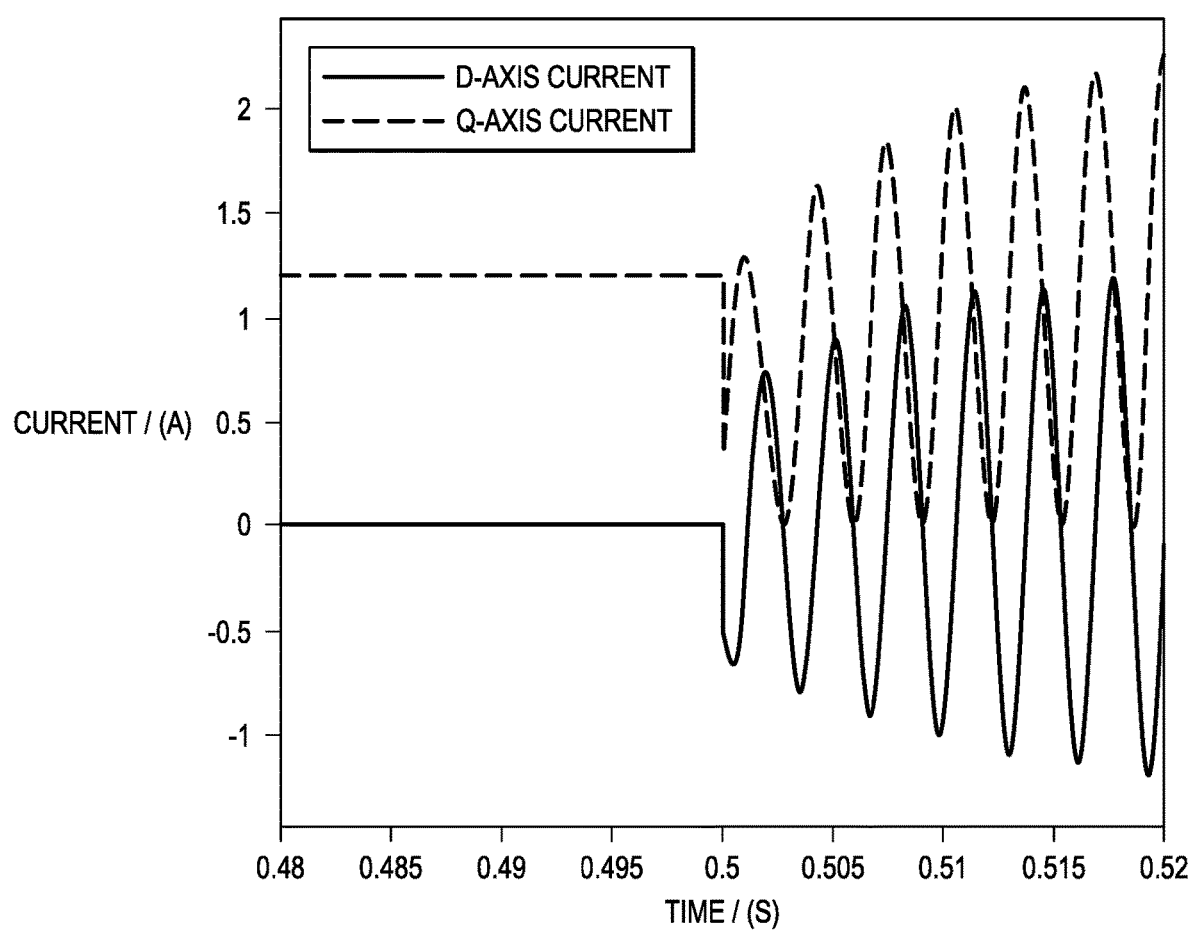

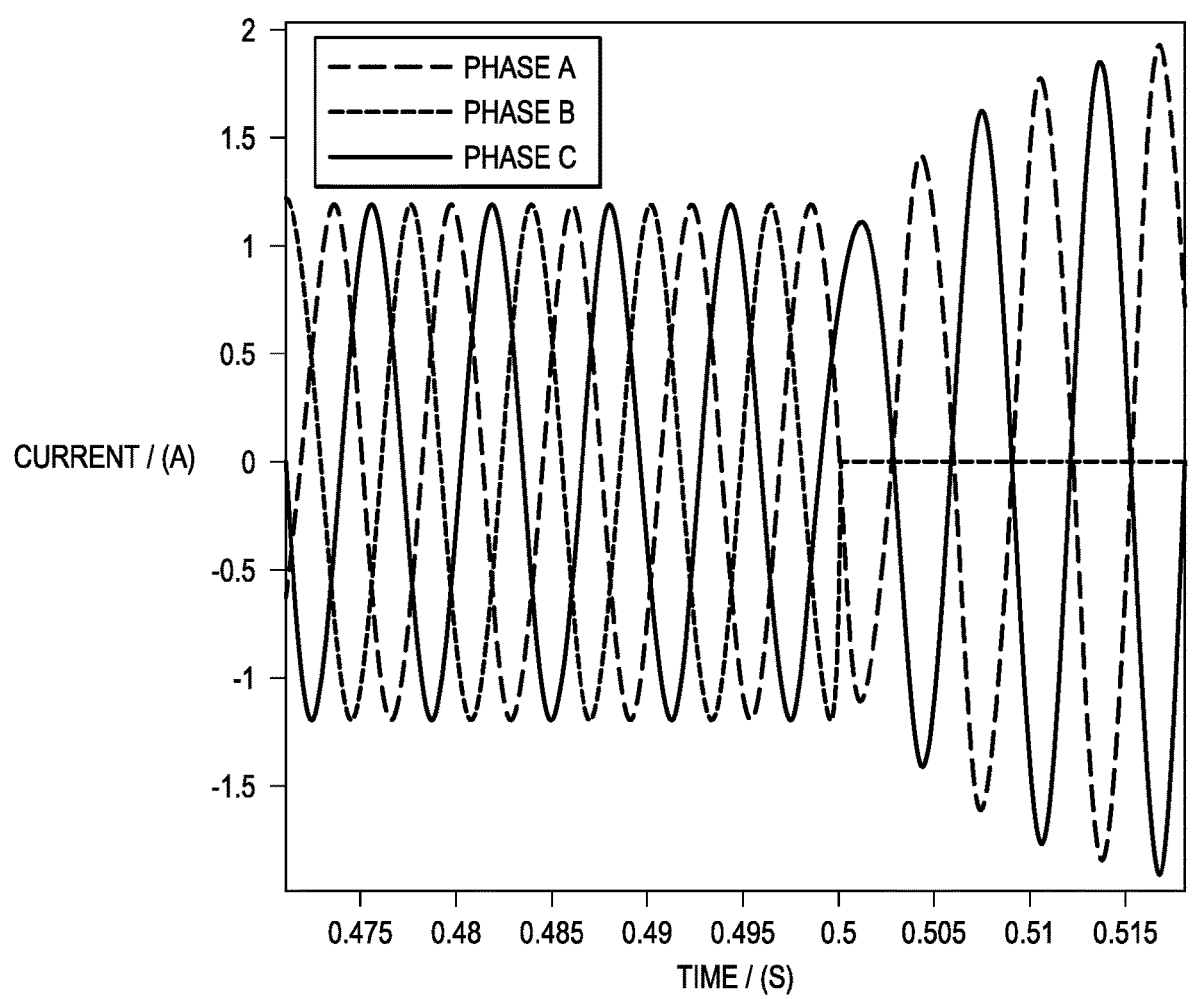

DETECTING FAULTS IN FIELD ORIENTED CONTROLLED PERMANENT MAGNET SYNCHRONOUS MACHINES

CROSS-REFERENCE TO RELATED APPLICATIONS

This application is a continuation of U.S. patent application Ser. No. 15/906,981 filed Feb. 27, 2018, which is a continuation of U.S. patent application Ser. No. 14/508,840 filed Oct. 7, 2014 (issued as U.S. Pat. No. 9,903,917), all of which are incorporated herein by reference in their entirety.

BACKGROUND

This relates generally to electronic circuitry, and more particularly to detecting faults in field oriented controlled (FOC) permanent magnet synchronous machines (PMSM) and drives.

Electric machines are useful in a range of applications, such as industrial applications, household appliances, automotive pumps and fans, and aerospace applications. Most of such applications require safe and reliable operation of the machine and any associated drive system. Faults in an electric machine can occur for numerous reasons, including mechanical vibration, thermal cycling, thermal shock, manufacturing defects and improper maintenance. Detection of electric machine faults can prevent damage to the machine, the drive electronics, personnel, and other equipment.

SUMMARY

In a fault detection circuit, a threshold detector circuit has: first and second inputs adapted to be respectively coupled to first and second rotor reference frame current outputs of a regulator circuit; and an amplitude magnitude output. A signal detector has: an input coupled to the amplitude magnitude output; and a detection output. A comparator has: a first input coupled to the detection output; a second input coupled to an amplitude threshold node; and a comparator output. The comparator is configured to: compare a signal at the detection output to a signal at the amplitude threshold node; and responsive to that comparison, output a comparison signal at the comparator output. The comparison signal is indicative of whether a permanent magnet motor fault exists. A signal at the first rotor reference frame current output has a D-axis current value, and a signal at the second rotor reference frame current output has a Q-axis current value. The signal at the detection output has a value equal to a magnitude of the D-axis current divided by a sum of magnitudes of the D-axis current and the Q-axis current.

BRIEF DESCRIPTION OF THE DRAWINGS

FIG. 3A is an example diagram of a D-Q current signature (rotor reference frame current signature) according to this disclosure;

FIG. 3B is an example diagram of a phase current signature according to this disclosure;

DETAILED DESCRIPTION OF EXAMPLE EMBODIMENTS

Electric machines are utilized in a range of applications including industrial applications, household appliances, automotive traction, pumps and fans, and aerospace applications. Most of such applications require safe and reliable operation of the machine and any associated drive system. Faults in an electric machine can occur for numerous reasons, including mechanical vibration, thermal cycling, thermal shock, manufacturing defects and improper maintenance. Applications of permanent magnet synchronous machines (PMSMs) are proliferating due to power density, efficiency gains, and simplicity in control algorithms. Field Oriented Control (FOC) is one control algorithm applied towards the control of PMSMs due to simplicity. Some typical faults that can occur in a PMSM drive system are listed below.

TABLE 01

| PMSM Machine Drive System Failure Modes | |
|---|---|
| Machine Fault | Drive Fault |
| Bearing Failure | Switch Failure |
| Winding failure (within a phase) | Single leg failure |
| Winding failure (between phases) | Multiple phase failure |
| Magnet failure | Switch short to phase |
| Open phase fault | Switch short to ground |

A winding short in a rotating PMSM is essentially a loop of conductor rotating in a magnetic field. The conductor loop is induced with a voltage generating a current flow in a low resistance path. Currents beyond the rated current for the winding can circulate in the loop of the conductor even at low speeds due to low resistance. Exceeding the rated current of the winding can cause overheating of the machine and can lead to potentially harmful circumstances. The immediate detection of a winding fault will prevent damage to the machine, the drive electronics, personnel, and other equipment.

Figure 1:
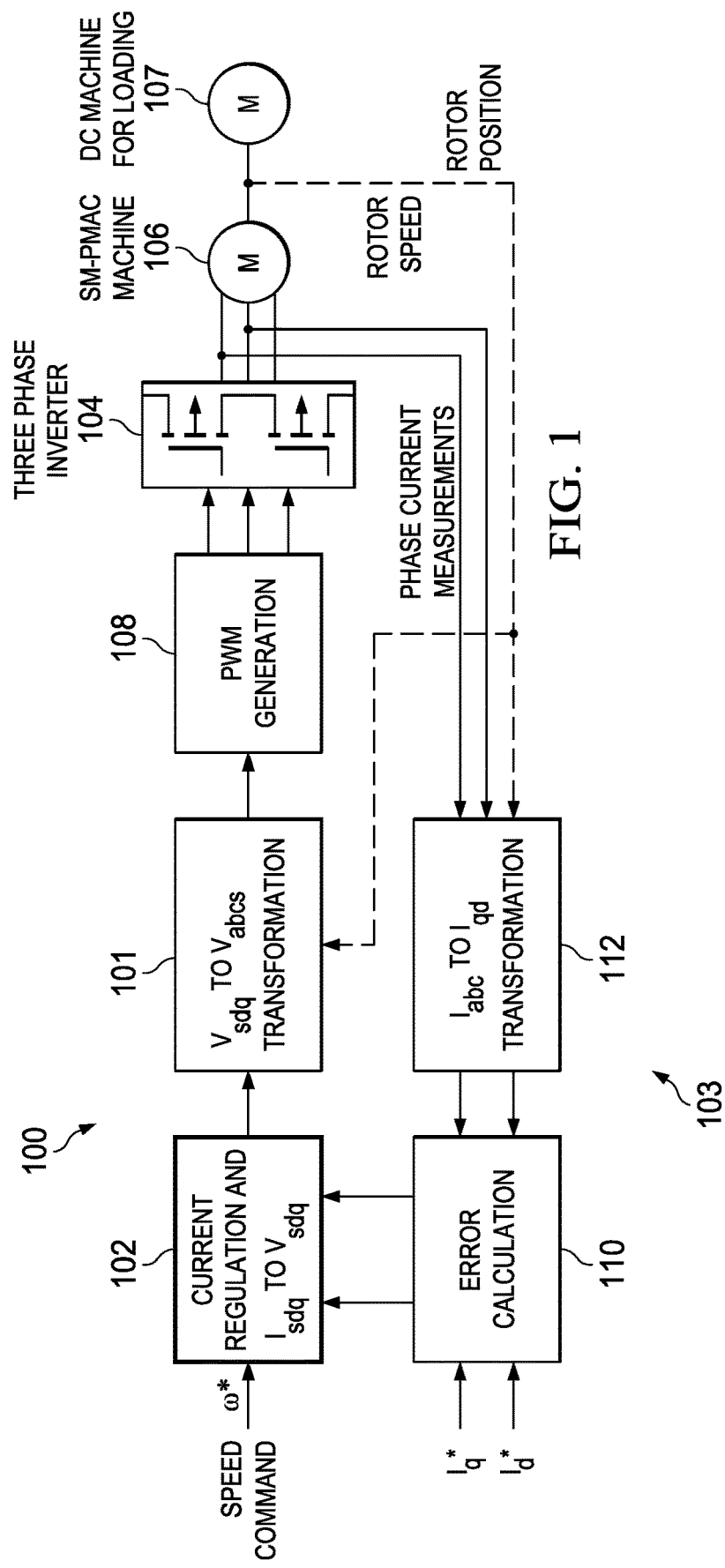
FIG. 1 is an example block diagram of a system with a field oriented controlled (FOC) permanent magnet synchronous machine (PMSM) according to this disclosure.

FIG. 1 is an example block diagram of a system, indicated generally at 100, with a field oriented controlled (FOC) permanent magnet synchronous machine (PMSM) according to this disclosure. As shown in FIG. 1, the system 100 includes a rotor reference frame current regulation scheme and $I_{dq}$ to $V_{dq}$ converter unit 102 (hereinafter the RC unit 102), a rotor reference frame voltage form ($V_{dq}$) to phase voltage form ($V_{abcs}$) transformation unit 101 (hereinafter line voltage to phase voltage transformation unit 101), a pulse-width-modulation (PWM) generation unit 108, an inverter 104, a permanent magnet motor 106, DC machine or any mechanism for loading 107 (hereinafter machine 107), and a proportional-integral-derivative (PID) regulator 103. The PID regulator 103 includes an error calculation unit 110. The system also includes a Clark and Park (CP) transformation unit 112.

The RC unit 102 receives two line current forms ($I_{dq}$) and converts the two line current forms to two rotor reference frame voltage forms ($V_{dq}$). The RC unit 102 transmits the two rotor reference frame voltage forms to the rotor reference frame voltage to phase voltage transformation unit 101.

The rotor reference frame voltage to phase voltage transformation unit 101 converts the two rotor reference frame voltage forms to a phase voltage form ($V_{abcs}$). The phase voltage form is supplied to the PWM generation unit 108. The PWM generation unit 108 controls the width of the pulse, formally the pulse duration, based on modulator signal information.

The inverter 104 receives the phase voltage form from the PMW generation unit 108 and converts the direct current (DC) power into alternating current (AC) power. In this example, the inverter 104 represents a three-phase inverter that converts DC power into three-phase AC power which is provided to the motor 106. The inverter 104 includes any suitable structure for converting power from DC form to AC form. For example, the inverter 104 could include one or more transistor switches driven using pulse width modulation (PWM) signals.

The motor 106 represents a permanent magnet motor that operates using the voltages provided by the inverter 104. The motor 106 includes a rotor with magnets embedded in or connected to the rotor. The motor 106 also includes a stator with multiple teeth around which conductive windings are wound. The windings are selectively energized and de-energized based on the signals from the inverter 104, which creates a rotating magnetic field that causes the rotor to rotate. The motor 106 drives a machine 107. The motor can drive the machine 107 with, for example, a drive shaft and one or more gears.

The system 100 further includes a proportional-integral-derivative (PID) regulator 103. In an embodiment, the PID regulator 103 is a proportional-integral (PI) regulator. The controller includes a PID regulator 103 with an error calculation unit 110 and a Clark and Park (CP) transformation unit 112. The CP transformation unit 112 receives balanced three-phase AC currents from the inverter 104 in the stator reference frame and converts the balanced three-phase AC currents in the stator frame into two currents in the rotor reference frame ($I_g$ and $I_d$, Q and D axis currents). The CP transformation unit 112 transmits the two line currents to the error calculation unit 110. The error calculation unit 110 adjusts the two line currents which are subsequently fed to the RC unit 102.

The RC unit 102, the rotor reference frame voltage to phase voltage transformation unit 101, and the PWM generation unit 108 together control the operation of the inverter 104 to thereby control the operation of the motor 106. For example, the PWM generation unit 108 generates PWM signals that drive the transistor switches in the inverter 104. By controlling the duty cycles of the PWM signals, the PWM generation unit 108 controls the three-phase voltages provided by the inverter 104 to the motor 106.

In this example, the RC unit 102 receives as input a commanded speed signal ω*, which identifies a desired speed of the motor 106. The RC unit 102 also receives as input feedback from the PID regulator 103 where the feedback identifies the estimated motor speed, rotor position, or other characteristic(s) of the motor 106. The PWM generator 108 uses the inputs to generate PWM signals for driving the transistor switches in the inverter 104.

Although FIG. 1 illustrates one example of a system 100 with a field oriented controlled (FOC) permanent magnet synchronous machine (PMSM), various changes can be made to FIG. 1 without departing from the scope of this disclosure. For example, various components in FIG. 1 can be combined or further subdivided. As a particular example, one or more of the components 101, 102, 104, and 108 could be incorporated into the motor 106 itself.

Figure 2:
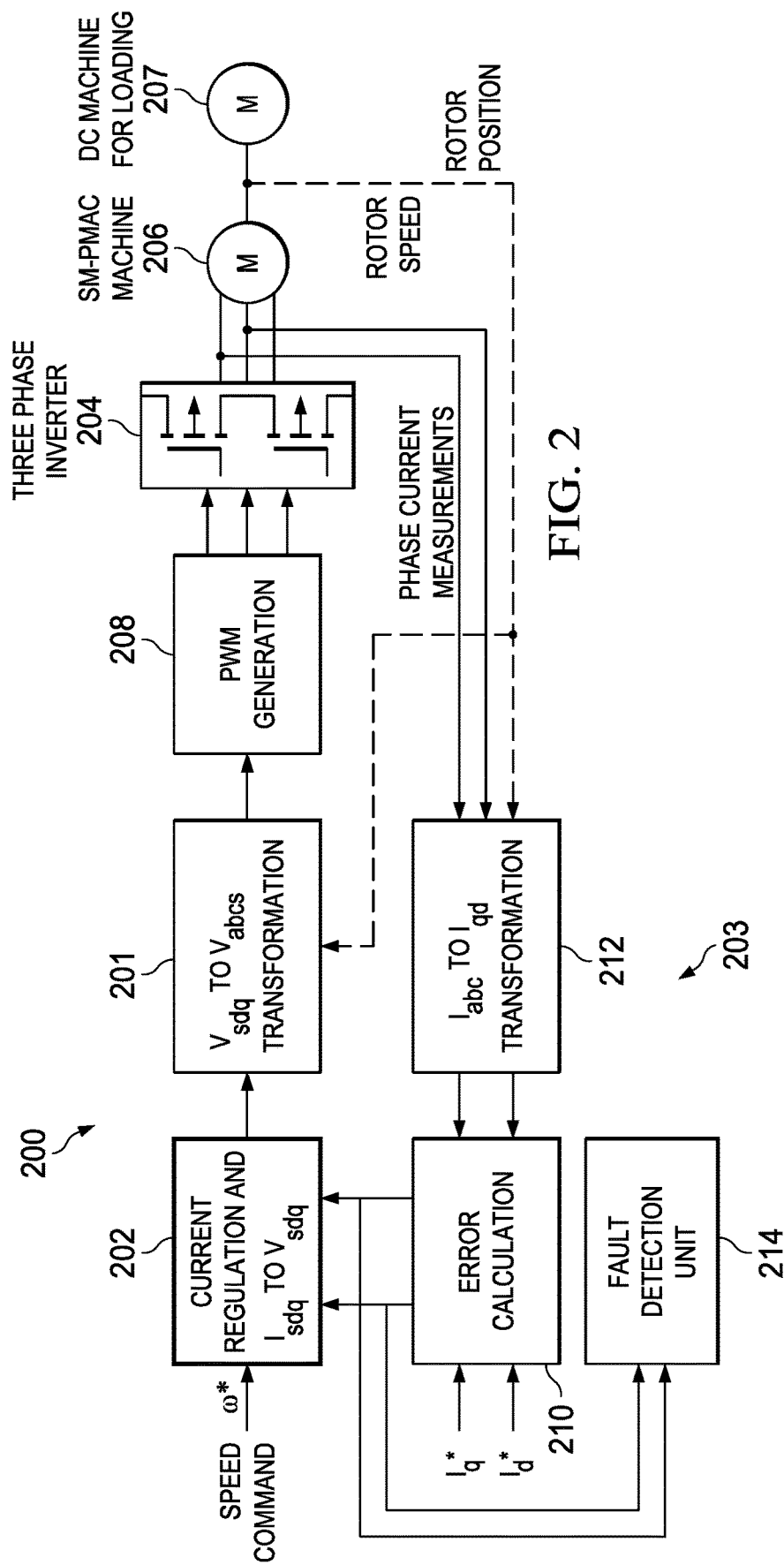
FIG. 2 is an example block diagram of a system for detecting faults in FOC PMSM machines and drives according to this disclosure.

FIG. 2 is an example block diagram of a system, indicated generally at 200, for detecting faults in field oriented controlled (FOC) permanent magnet synchronous machines (PMSMs) according to this disclosure. As shown in FIG. 2, the system 200 includes an RC unit 202, a rotor reference frame voltage to phase voltage transformation unit 201, a PWM generation unit 208, an inverter 204, a permanent magnet motor 206, a machine 207, and a PID regulator 203. The PID regulator 203 includes an error calculation unit 210 and a Clark and Park (CP) transformation unit 212. Each of these components of system 200 are the same as or are similar to the corresponding RC unit 102, line voltage to phase voltage transformation unit 101, PWM generation unit 108, inverter 104, permanent magnet motor 106, machine 107, and PID regulator 103 including the error calculation unit 110 and the CP transformation unit 112 illustrated in FIG. 1.

The system 200 also includes a fault detection unit 214. The fault detection unit 214 detects an existence of a fault in the permanent magnet motor 206 by executing a detection algorithm based on a rotor reference frame current signature (D-Q current signature) due to machine imbalance caused by the fault. For example, for control purposes, an electric machine is considered a balanced three phase machine. An FOC algorithm relies on a balanced machine that is controlled with a balanced set of three phase currents. When the CP transformation unit 212 is activated, balanced three phase currents in the stator reference frame transform into two DC like signals (non-sinusoidal) in the rotor reference frame. Each of the two DC signals is in a steady state after the transient period.

If a fault exists, the three phase currents will be unbalanced during steady state operation and the CP transformation unit 212 does not produce two DC signals in the rotor reference frame that are in a steady state. In this case, an unbalanced motor has rotor reference frame currents with a sinusoidal component superimposed on the DC component. The fault detection unit 214 identifies the sinusoidal component superimposed on the DC component and determines that a fault exists, for example based on an amplitude value of the sinusoidal component.

FIG. 3A is an example diagram of a D-Q current according to this disclosure. An analogous variation is reflected on the PID controller error output and control signal output, which are being utilized for fault diagnostic and localization. The fault detection unit 214 detects the existence of faults. For example, as shown in FIG. 3A, the fault detection unit 214 receives a plurality of D-Q current values over a period of time producing a D-Q current signature. From the 0.48 second mark up to the 0.5 second mark, the fault detection unit 214 determines that the motor and the phase currents are balanced as the D-Q current signature is in a steady state. At the 0.5 second mark, the D-Q current signature changes from a steady state current to sinusoidal currents. The rotor reference frame PID regulator outputs are also affected by the sinusoidal currents. The fault detection unit 214 determines that the motor and the phase currents are out of balance as the D-Q current errors are not in a steady state, thus indicating the existence of a fault.

FIG. 3B is an example diagram of a phase current signature according to this disclosure. The fault detection unit 214 derives the D-Q current signature from the phase current signature, for example after the fault detection unit 214 determines the existence of a fault. The derived D-Q current signature has the same or similar phase current signature provided to the motor 206 from the inverter 204. By deriving the D-Q current signature from the phase signature, the fault detection unit 214 can identify the type of fault. For example, the derived D-Q current signature illustrated in FIG. 3A follows the phase current signature illustrated in FIG. 3B. As illustrated in FIG. 3B, from the 0.48 second mark up to the 0.5 second mark, the derived phase current signature illustrates three sinusoidal current signatures (phases A, B, and C) with the same or similar amplitudes reflecting the steady state D-Q current signature within the same time frame. At the 0.5 second mark, the phase current signature changes so that the phase B current signature has zero amplitude while the phase A and phase C current signatures have increasing amplitudes reflecting the fault condition identified using the sinusoidal D-Q current signature of FIG. 3A.

D-Q currents and the rotor position together are utilized to locate the location of fault occurrence. The rotor position can be estimated or acquired via a rotor position sensor. For example, a particular configuration or pattern of the phase current signature can identify switch failures, single leg failures, switch open failures, switch short to ground failures, and the like. Based on the identifications of fault types, the fault detection unit 214 can determine a location of the fault.

Additionally the fault detection unit 214 uses an algorithm to detect the faulty phase. A faulty phase identification scheme is based on the phase shift induced in the function 'f', with respect to the actual rotor position due to the fault condition. The derivation is as follows assuming a fault on phase 'C'.

$$i_{qs}^r = \frac{2}{3}\left[\cos(\theta)i_{as} + \cos\left(\theta - \frac{2\pi}{3}\right)i_{bs} + \cos\left(\theta - \frac{4\pi}{3}\right)i_{cs}\right] \quad \text{Eq. (1)}$$

$$i_{qs}^r = \frac{2}{3}\left[\cos(\theta)i_{as} - \cos\left(\theta - \frac{2\pi}{3}\right)i_{as}\right] \quad \text{Eq. (2)}$$

$$i_{qs}^r = \frac{-2}{\sqrt{3}}\left[i_{as}\sin\left(\theta - \frac{\pi}{3}\right)\right] \quad \text{Eq. (3)}$$

$$i_{ds}^r = \frac{2}{3}\left[\sin(\theta)i_{as} + \sin\left(\theta - \frac{2\pi}{3}\right)i_{bs} + \sin\left(\theta - \frac{4\pi}{3}\right)i_{cs}\right] \quad \text{Eq. (4)}$$

$$i_{ds}^r = \frac{2}{3}\left[\sin(\theta)i_{as} - \sin\left(\theta - \frac{2\pi}{3}\right)i_{as}\right] \quad \text{Eq. (5)}$$

$$i_{ds}^r = \frac{2}{\sqrt{3}}\left[i_{as}\cos\left(\theta - \frac{\pi}{3}\right)\right] \quad \text{Eq. (6)}$$

$$f = \frac{i_{qs}^r}{i_{ds}^r} = -\tan\left(\theta - \frac{\pi}{3}\right) \quad \text{Eq. (7)}$$

If the actual electrical angle is known, the phase shift in the above signal 'f' can be extracted. The phase shift will indicate the faulty winding/phase.

$$\angle f = \angle(\theta_{electrical}(t)) - \angle\left(\tan^{-1}\left(\frac{-i_{qs\_error}^r(t)}{i_{ds\_error}^r(t)}\right)\right)$$

Although FIG. 2 illustrates one example of a system 200 for detecting faults in field oriented controlled (FOC) permanent magnet synchronous machines (PMSMs), various changes can be made to FIG. 2 without departing from the scope of this disclosure. For example, various components in FIG. 2 can be combined or further subdivided. As a particular example, one or more of the components 201, 202, 204, and 208 could be incorporated into the motor 206 itself.

Figure 4:
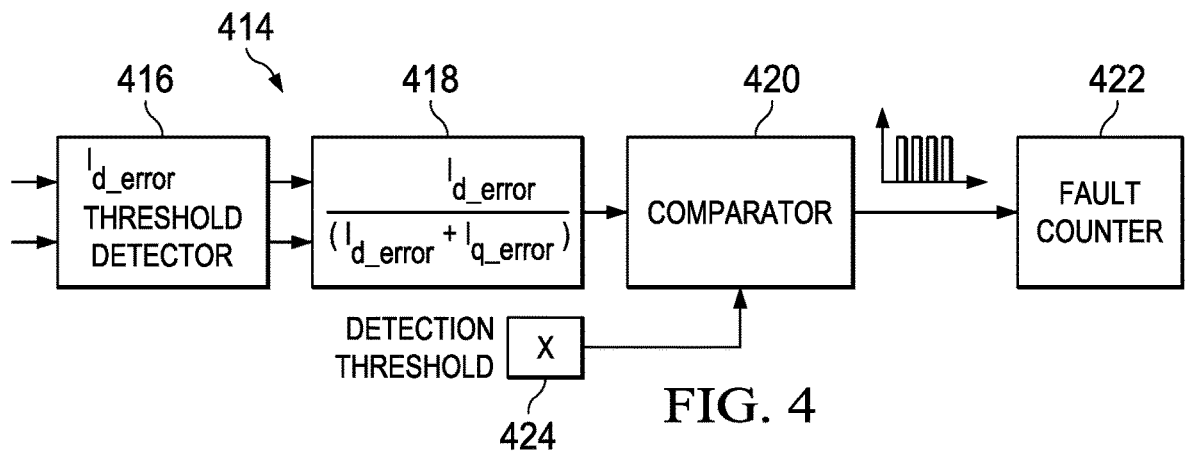
FIG. 4 is an example block diagram of a fault detection unit according to this disclosure.

FIG. 4 is an example block diagram of a fault detection unit 414 according to this disclosure. The design details of the fault detection unit 414 could be incorporated into the fault detection unit 214 in the system 200 of FIG. 2. Of course, these design details could be incorporated into other fault detection units operating in other systems. As shown in FIG. 4, the fault detection unit 414 includes a threshold detector 416, a detection signal generation unit 418, a comparator 420, a fault counter 422, and detection threshold storage unit 424.

The threshold detector 416 receives at least two outputs from a proportional-integral-derivative (PID) regulator (such as PID regulator 203 of FIG. 2). The at least two outputs include at least two rotor reference frame D-Q current signatures. The threshold detector 416 determines a magnitude of an amplitude for each of the at least two rotor reference frame D-Q currents in order to enable the fault detection circuit. For example, when the motor 206 is balanced, the threshold detector 416 will determine that the magnitude of the each of the at least two rotor reference frame D-Q currents is a value equal to zero or close to zero, as the rotor reference frame currents are in steady state. When the motor 206 is not balanced, the threshold detector 416 will determine that the magnitude of the amplitude for each of the at least two rotor reference frame D-Q currents is a value significantly greater than zero, as the rotor reference frame currents are not in a steady state. After the at least two rotor reference frame D-Q current signatures pass through the threshold detector 416, the at least two rotor reference frame D-Q current signatures are received by the detection signal generation unit 418.

The detection signal generation unit 418 receives the at least two rotor reference frame D-Q current signatures and generates a detection signal based on the at least two rotor reference frame D-Q current signatures. That is, the detection signal is a single signal that is a combination of the D current signature and the Q current signature. The detection signal identifies a single amplitude magnitude value from a single signal based on the magnitudes of the amplitudes for each of the at least two rotor reference frame D-Q current signatures. The detection signal generation unit 418 calculates the single amplitude magnitude value to provide an accurate amplitude magnitude value. The detection signal generation unit 418 can generate a detection signal using the following equation:

$$I_{d\_error}^x/(I_{d\_error}^x + I_{q\_error}^x); x \times 1,2,3, \ldots$$

After the detection signal generation unit 418 generates the detection signal, the detection signal generation unit 418 transmits the detection signal to the comparator 420.

The comparator 420 receives the detection signal and compares the single amplitude magnitude value of the detection signal with an amplitude threshold value to identify an existence of a permanent magnet motor fault. For example, if the single amplitude magnitude value is greater than the amplitude threshold, then a fault exists. The detection threshold storage unit 424 stores the amplitude threshold value and provides the amplitude threshold value to the comparator 420 for signal comparisons.

The fault detection unit 414 also includes a fault counter 422. The fault counter 422 verifies that a fault exists. For example, after determining that a first fault exists, the fault counter 422 counts the number of subsequent fault signal threshold crossings that are detected at the comparator 420. When the fault counter 422 detects a predetermined quantity of subsequent faults, the fault counter 422 verifies that the fault exists. The fault counter 422 can verify that a fault exists after detecting at least one subsequent fault. The fault counter 422 can verify that a fault exists after a predetermined quantity of faults is detected within a predetermined period of time. The fault counter 422 can verify that a fault exists when a predetermined quantity of consecutive faults signal threshold crossings are detected within a predetermined period of time. The fault counter 422 can verify that a fault exists when a percentage of faults versus non-faults are detected within a predetermined period of time.

Figure 5:
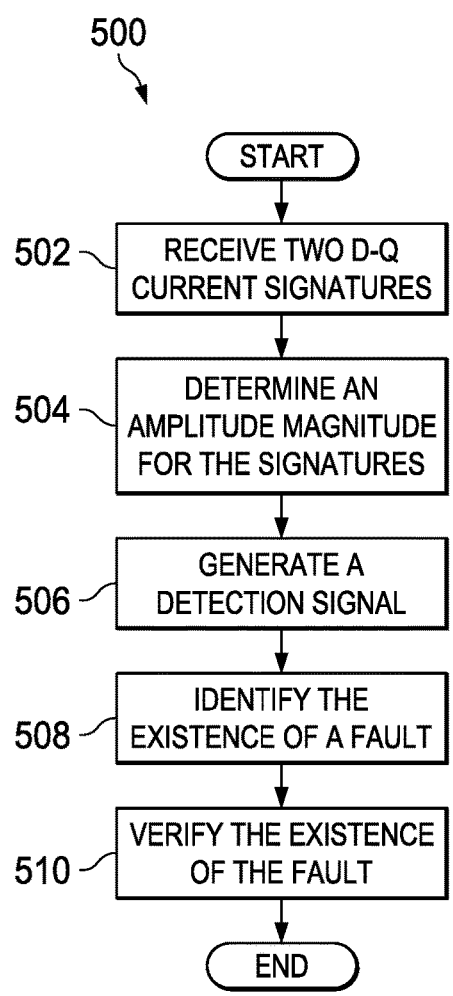
FIG. 5 is a flow diagram of an example fault detection method according to this disclosure.

FIG. 5 is a flow diagram of an example fault detection method 500 according to this disclosure. At step 502, a fault detection unit 414 receives at least two outputs or output streams from a proportional-integral-derivative (PID) regulator. The at least two outputs include at least two rotor reference frame currents or current signatures. At step 504, the fault detection unit 414 determines a magnitude of an amplitude of each of the at least two rotor reference frame currents. At step 506, the fault detection unit 414 generates a detection signal based on the at least two rotor reference frame currents. The detection signal identifies a single amplitude magnitude value based on the magnitudes of the amplitudes for each of the at least two rotor reference frame currents. At step 508, the fault detection unit 414 identifies the existence of a fault based on a comparison between the single amplitude magnitude value and an amplitude threshold value. For example, the fault detection unit 414 can compare the single amplitude magnitude value with an amplitude threshold value and determine if a fault exists based on the comparison. At step 510, the fault detection unit 414 verifies the existence of the permanent magnet motor fault by comparing a predetermined quantity of subsequent single amplitude magnitude values with the amplitude threshold value.

Although FIG. 5 illustrates one example of a fault detection method 500, various changes may be made to FIG. 5. For example, while FIG. 5 illustrates a series of steps, various steps in each figure could overlap, occur in parallel, occur in a different order, or occur any number of times. Also, one or more of the steps of the method 500 could be removed, or other steps could be added to the method 500. Moreover, while the method 500 is described as being performed by the fault detection unit 414, the method 500 could be performed by any other suitable unit, device, or system.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

In this description, the terms "application" and "program" refer to one or more computer programs, software components, sets of instructions, procedures, functions, objects, classes, instances, related data, or a portion thereof adapted for implementation in a suitable computer code (including source code, object code, or executable code). The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A; B; C; A and B; A and C; B and C; and A and B and C.

Modifications are possible in the described embodiments, and other embodiments are possible, within the scope of the claims.

What is claimed is:

1. A method comprising:
   receiving, from an error generator, a D-axis current error signal,
   receiving, from the error generator, a Q-axis current error signal, in which one or both of the D-axis and Q-axis current error signals have a respective sinusoidal component;
   generating, by a detection signal generator, a first value based on the D-axis current error signal;
   generating, by the detection signal generator, a second value based on the Q-axis current error signal;
   generating, by the detection signal generator, a fault detection signal based on a ratio between the first value and the second value;
   comparing, by a comparator, the fault detection signal to a threshold to generate a comparison result; and
   determining, by a fault detector, whether a fault occurs based on the comparison;
   wherein the first value represents a first amplitude of a sinusoidal component of D-axis current error signal, and the second value represents a second amplitude of a sinusoidal component of the Q-axis current error signal.

2. The method of claim 1, further comprising:
   detecting, by the error generator, the respective sinusoidal component in the one or both of the D-axis and Q-axis current error signals, wherein the fault detection signal is generated by the detection signal generator responsive to the error generator detecting the respective sinusoidal component in the one or both of the D-axis and Q-axis current error signals.

3. The method of claim 2, wherein the threshold is a first threshold, and detecting the respective sinusoidal component in the one or both of the D-axis and Q-axis current error signals includes:
   comparing the D-axis and Q-axis current error signals to a second threshold.

4. The method of claim 1, further comprising:
   receiving, by the fault detector, a signal representing a rotor position; and
   determining, by the fault detector, a location of the fault based on the D-axis and Q-axis current error signals and the rotor position.

5. The method of claim 4, wherein determining the location of the fault includes determining a phase shift between an actual electrical angle and an electrical angle based on the D-axis and Q-axis current error signals.

6. The method of claim 1, further comprising:
determining that the fault occurs responsive to the comparison result indicating that the fault detection signal exceeds the threshold.

7. The method of claim 1, further comprising:
identifying, by the fault detector, a pattern from three-phase currents; and
determining, by the fault detector, a type of the fault based on the identified pattern.

8. The method of claim 1, wherein the threshold is a first threshold, the method further comprising:
determining, by the fault detector, a number of times the fault detection signal exceeds the first threshold; and
determining, by the fault detector, that the fault occurs responsive to the number of times exceeding a second threshold.

9. The method of claim 1, wherein the second value is based on the D-axis current error signal and the Q-axis current error signal.

10. The method of claim 1, wherein the first value represents an amplitude of the D-axis current error signal to a m-th power, the second value represents an amplitude of the Q-axis current error signal to an n-th power, and m and n are non-zero.

11. The method of claim 10, wherein the first value represents the amplitude of the D-axis current error signal to the m-th power, and the second value represents a sum of the amplitude of the D-axis current error signal to the n-th power and the amplitude of the Q-axis current error signal to the n-th power.

12. A non-transitory computer readable medium storing instructions that, when executed by a processor, cause the processor to:
receiving, from an error generator, a D-axis current error signal and a Q-axis current error signal, in which one or both of the D-axis and Q-axis current error signals have a respective sinusoidal component;
generate a first value based on the D-axis current error signal;
generate a second value based on the Q-axis current error signal;
generate a fault detection signal based on a ratio between the first value and. the second value;
compare the fault detection signal to a threshold to generate a comparison result; and
determine whether a fault occurs based on the comparison result;
wherein the first value represents a first amplitude of a sinusoidal component of D-axis current error signal, and the second value represents a second amplitude of a sinusoidal component of the Q-axis Current error signal.

13. The non-transitory computer readable medium of claim 12, wherein the threshold is a first threshold, and the non-transitory computer readable medium stores instructions that, when executed by the processor, cause the processor to detect respective sinusoidal component in the one or both of the D-axis and Q-axis current error signals by comparing the D-axis and Q-axis current error signals to a second threshold, and generate the first and second values based on the detected respective sinusoidal component.

14. The non-transitory computer readable medium of claim 12, wherein the threshold is a first threshold, and the non-transitory computer readable medium stores instructions that, when executed by the processor, cause the processor to:
determine a number of times the fault detection signal exceeds the first threshold; and
determine that the fault occurs responsive to the number of times exceeding a second threshold.

15. The non-transitory computer readable medium of claim 12, wherein the non-transitory computer readable medium stores instructions that, when executed by the processor, cause the processor to:
receiving a rotor position; and
determine a location of the fault based on the D-axis and Q-axis current error signals and the rotor position.

16. The non-transitory computer readable medium of claim 15, wherein the non-transitory computer readable medium stores instructions that, when executed by the processor, cause the processor to determine a phase shift between an actual electrical angle and an electrical angle based on the D-axis and Q-axis current error signals.

17. The non-transitory computer readable medium of claim 12, wherein the non-transitory computer readable medium stores instructions that, when executed by the processor, cause the processor to:
identify a pattern from three-phase currents; and
determine a type of the fault based on the identified pattern.

18. The non-transitory computer readable medium of claim 12, wherein the second value is based on the D-axis current error signal and the Q-axis current error signal.

19. The non-transitory computer readable medium of claim 12, wherein the first value represents an amplitude of the D-axis current error signal to a m-th power, the second value represents an amplitude of the Q-axis current error signal to an n-th power, and m and n are non-zero.

20. The non-transitory computer readable medium of claim 19, wherein the first value represents the amplitude of the D-axis current error signal to the m-th power, and the second value represents a sum of the amplitude of the D-axis current error signal to the n-th power and the amplitude of the Q-axis current error signal to the n-th power.

21. A circuit comprising:
a first circuit having first and second inputs and an output, the first circuit configured to:
receive a D-axis current error signal at the first input and a Q-axis current error signal at the second input, in which one or both of the D-axis and Q-axis current error signals have a respective sinusoidal component;
generate a first value based on the D-axis current error signal;
generate a second value based on the Q-axis current error signal; and
provide a fault detection signal at the output based on a ratio between the first value and the second value;
a comparator circuit having first and second inputs and an output, the first input of the comparator circuit coupled to the output of the first circuit,
the comparator circuit configured to provide a comparison signal at its output by comparing the fault detection signal to a threshold at its second input; and
a second circuit having an input coupled to output of the comparator, the second circuit configured to determine whether a fault occurs machine based on the comparison signal;
wherein the first value represents a first amplitude of a sinusoidal component of the D-axis current error signal, and the second value represents a second amplitude of a sinusoidal component of the Q-axis current error signal.

22. The circuit of claim 21, wherein the threshold is a first threshold, and the second circuit is configured to:
  determine a number of times the fault detection signal exceeds the first threshold; and
  determine that the fault occurs responsive to the number of times exceeding a second threshold.

23. The circuit of claim 21, wherein the second circuit is configured to determine that the fault occurs responsive to the fault detection signal exceeding the threshold.

24. The circuit of claim 21, wherein the threshold is a first threshold, and the circuit further comprising a third circuit having first and second outputs, its first output coupled to the first input of the first circuit, its second output coupled to the second input of the first circuit, the third circuit configured to:
  compare the D-axis and Q-axis current error signals to a second threshold; and
  provide the D-axis and Q-axis current error signals, respectively, at its first and second outputs responsive to one or both of the D-axis and Q-axis current error signals exceeding the second threshold.

25. The circuit of claim 21, wherein the second value is based on the D-axis current error signal and the Q-axis current error signal.

26. The circuit of claim 21, wherein the first value represents an amplitude of the D-axis current error signal to a m-th power, the second value represents an amplitude of the Q-axis current error signal to an n-th power, and m and n are non-zero.

27. The circuit of claim 26, wherein the first value represents the amplitude of the D-axis current error signal to the m-th power, and the second value represents a sum of the amplitude of the D-axis current error signal to the n-th power and the amplitude of the Q-axis current error signal to the n-th power.

* * * * *